US012672417B2

(12) United States Patent
Kang et al.

(10) Patent No.: US 12,672,417 B2
(45) Date of Patent: Jun. 30, 2026

(54) THERMOCOMPRESSION DEVICE AND METHOD OF MANUFACTURING DISPLAY DEVICE USING SAME

(71) Applicant: LG ELECTRONICS INC., Seoul (KR)

(72) Inventors: Eunjeong Kang, Seoul (KR); Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 696 days.

(21) Appl. No.: 18/019,320

(22) PCT Filed: Aug. 18, 2020

(86) PCT No.: PCT/KR2020/010994
§ 371 (c)(1),
(2) Date: Feb. 2, 2023

(87) PCT Pub. No.: WO2022/039290
PCT Pub. Date: Feb. 24, 2022

(65) Prior Publication Data
US 2023/0282792 A1      Sep. 7, 2023

(51) Int. Cl.
| | |
|---|---|
| *H10H 29/20* | (2026.01) |
| *H10H 20/857* | (2025.01) |
| *H10H 29/01* | (2025.01) |
| *H10H 29/03* | (2025.01) |
| *H10H 29/24* | (2025.01) |
| *H10W 40/10* | (2026.01) |
| *H10W 90/00* | (2026.01) |

(52) U.S. Cl.
CPC .......... *H10H 29/20* (2025.01); *H10H 20/857* (2025.01); *H10H 29/01* (2025.01); *H10H*

*29/03* (2025.01); *H10H 29/24* (2025.01); *H10W 40/10* (2026.01); *H10W 90/00* (2026.01)

(58) Field of Classification Search
None
See application file for complete search history.

(56) References Cited

U.S. PATENT DOCUMENTS

| | | | |
|---|---|---|---|
| 2006/0087545 A1 | 4/2006 | Sakurada et al. | |
| 2012/0279653 A1* | 11/2012 | Matsumura ............ | H05K 3/305 156/583.1 |

FOREIGN PATENT DOCUMENTS

| | | | |
|---|---|---|---|
| JP | 2018-60993 A | 4/2018 | |
| KR | 10-2014-0025055 A | 3/2014 | |
| KR | 10-2017-0140479 A | 12/2017 | |
| KR | 10-2019-0040493 A | 4/2019 | |

* cited by examiner

*Primary Examiner* — Feifei Yeung Lopez
(74) *Attorney, Agent, or Firm* — Birch, Stewart, Kolasch & Birch, LLP

(57)      ABSTRACT

According to an embodiment, a thermocompression device for thermally compressing a semiconductor light emitting element array onto a wiring board may comprise: a lower head that supports the wiring board; an upper head that moves a donor including the semiconductor light emitting element array, and presses the semiconductor light emitting element array against a first region of the wiring board; a heating unit that heats at least one among the lower head and the upper head; a suction groove provided along an edge of the first region on the upper surface of the lower head; and a suctioning unit that communicates with the suction groove to suction the wiring board.

20 Claims, 21 Drawing Sheets

THERMOCOMPRESSION DEVICE AND METHOD OF MANUFACTURING DISPLAY DEVICE USING SAME

CROSS REFERENCE TO RELATED APPLICATIONS

This application is the National Phase of PCT/KR2020/010994 filed on Aug. 18, 2020, which is hereby expressly incorporated by reference into the present application.

BACKGROUND

Field

The present disclosure relates to a heat compression device for manufacturing a display device using a semiconductor light emitting element and a method for manufacturing the display device using the same. The present disclosure is applicable to a technology field for implementing a large screen display device.

Discussion of the Related Art

A light emitting diode (LED) is a well-known semiconductor light emitting element that converts current into light. Starting with commercialization of a red LED using a GaAsP compound semiconductor in 1962, the LED has been used as a light source for displaying an image of an electronic device including an information communication device along with a GaP: N-based green LED.

The semiconductor light emitting element is being miniaturized and classified into a mini LED with a size of hundreds of microns and a micro LED with a size of several to tens of microns. Recently, a display device using the mini LED and a display device using the micro LED are being developed.

However, as the semiconductor light emitting element is miniaturized, it is difficult to manufacture a display device having a large screen. The display device is manufactured by transferring the semiconductor light emitting element to a wiring substrate. Transferring each semiconductor light emitting element to the wiring substrate is not suitable for a product production efficiency. Therefore, a method for collectively transferring a semiconductor light emitting element array to the wiring substrate may be considered.

The semiconductor light emitting element array may be manufactured to correspond to a size of a wafer. As the size of the wafer increases, a semiconductor light emitting element array that may transfer the semiconductor light emitting elements of a large area size at once may be manufactured. However, because of an efficiency and a limitation of wafer production, recently a wafer having a size of 450 mm has been widely used. Therefore, the large screen display device may be manufactured by connecting and transferring the semiconductor light emitting element array to the wiring substrate constituting a large screen.

However, before transferring the semiconductor light emitting element array to the wiring substrate, a thermal compression operation of electrically connecting the wiring substrate and the light emitting element array to each other is performed. In the process of thermally compressing the semiconductor light emitting element array, there is a problem in that a connected state of a portion of the semiconductor light emitting element array transferred to an area adjacent to another semiconductor light emitting element array is damaged.

SUMMARY OF THE DISCLOSURE

An object of one embodiment of the present disclosure is to improve a display yield by collectively performing thermal compression on a semiconductor light emitting element array onto a wiring substrate.

Another object of one embodiment of the present disclosure is to manufacture a large screen display by connecting and thermally compressing a semiconductor light emitting element array to a wiring substrate.

Another object of one embodiment of the present disclosure is to solve a problem in which semiconductor light emitting elements transferred to an area adjacent to another semiconductor light emitting element array does not emit light in a process of thermally compressing a semiconductor light emitting element array to a wiring substrate.

Furthermore, another object of one embodiment of the present disclosure is to solve various problems not mentioned herein. A person skilled in the art may understand the entire meaning of the present document and drawings.

To achieve the above objects, a thermocompression device for thermally compressing a semiconductor light emitting element array to a wiring substrate includes a lower head for supporting the wiring substrate, an upper head for compressing the semiconductor light emitting element array to a first area of the wiring substrate using a donor having the semiconductor light emitting element array, a heater for heating at least one of the lower head and the upper head, an suction groove defined in an upper surface of the lower head along an edge of the first area, and a suction portion for providing a negative pressure to the suction groove.

In one implementation, the suction portion may provide the negative pressure to the suction groove while the semiconductor light emitting element array is thermally compressed to the first area.

In one implementation, the suction portion may provide the negative pressure to the suction groove in response to at least one of a heating temperature and a heating time of the heater and a compression pressure of the upper head.

In one implementation, the suction groove may be defined to be spaced apart from the first area by a preset distance.

In one implementation, the suction groove may be spaced apart from the first area by a distance of 3 times or more and 15 times or less of a pitch between semiconductor light emitting elements of the semiconductor light emitting element array.

In one implementation, the suction groove may have a width smaller than a width of the semiconductor light emitting element pixel pitch of the semiconductor light emitting element array.

In one implementation, the suction portion may provide the negative pressure to the suction groove by sucking air via a hole in communication with the suction groove.

In one implementation, the suction portion may include a plurality of holes along the suction groove.

In one implementation, the thermocompression device may include a roller assembly for moving the wiring substrate in a plane on the upper surface of the lower head.

In one implementation, the roller assembly may move the wiring substrate in the plane on the upper surface of the lower head such that a second area adjacent to the first area and having the same area size as the first area is defined to surround the suction groove.

In one implementation, the thermocompression device may include a rail for changing the position of the suction groove by moving the lower head in a plane on a lower surface of the wiring substrate.

In one implementation, the rail may move the lower head on a rear surface of the wiring substrate such that the second area adjacent to the first area and having the same area size as the first area is defined to surround the suction groove.

In one implementation, the thermocompression device may include sensing portion for sensing alignment of the wiring substrate with the suction groove.

In one implementation, the thermocompression device may include comprising laser lift off (LLO) equipment for removing the donor from the semiconductor light emitting element array while the semiconductor light emitting element array is thermally compressed to the first area.

To achieve the above objects, a method for manufacturing a display device by thermally compressing a semiconductor light emitting element array to a wiring substrate includes aligning the semiconductor light emitting element array on a first area of the wiring substrate, holding an edge of the first area in a direction of a rear surface of the wiring substrate while thermally compressing the semiconductor light emitting element array to the first area, aligning the semiconductor light emitting element array to a second area adjacent to the first area, and holding an edge of the second area in the direction of the rear surface of the wiring substrate while thermally compressing the semiconductor light emitting element array to the second area.

According to an embodiment of the present disclosure, the display yield may be improved by collectively performing the thermal compression on the semiconductor light emitting element array onto the wiring substrate.

According to an embodiment of the present disclosure, the large screen display may be manufactured by connecting and thermally compressing the semiconductor light emitting element array to the wiring substrate.

According to an embodiment of the present disclosure, the problem in which the semiconductor light emitting elements transferred to the area adjacent to another semiconductor light emitting element array does not emit the light in the process of thermally compressing the semiconductor light emitting element array to the wiring substrate may be solved.

Further, according to another embodiment of the present disclosure, there are also additional technical effects not mentioned here. A person skilled in the art may understand the entire meaning of the present document and drawings.

BRIEF DESCRIPTION OF THE DRAWINGS

FIGS. 3A and 3B are cross-sectional diagrams taken along the cutting lines B-B and C-C in FIG. 2;

FIG. 7 is a perspective diagram of a display device using a semiconductor light emitting element according to another embodiment of the present disclosure;

FIG. 10 is a basic conceptual diagram of a thermocompression device for thermally compressing a semiconductor light emitting element array on a wiring substrate;

FIG. 12 is a top view of a lower head to illustrate a process of connecting and thermally compressing semiconductor light emitting element arrays to a wiring substrate;

FIG. 13 is a view for illustrating a problem occurring in a process of connecting and thermally compressing semiconductor light emitting element arrays to a wiring substrate;

FIG. 16 is a top view of a lower head to illustrate alignment of an suction groove of a lower head with a semiconductor light emitting element array;

FIG. 17 is a top view of a lower head to illustrate a process of connecting and thermally compressing semiconductor light emitting element arrays to a wiring substrate.

DETAILED DESCRIPTION OF THE EMBODIMENTS

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
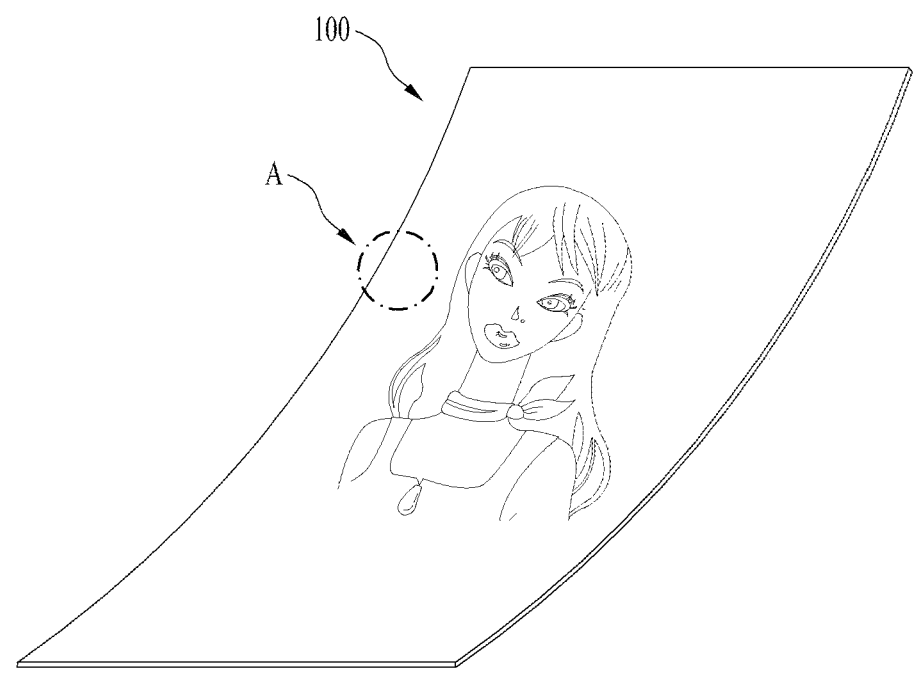
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
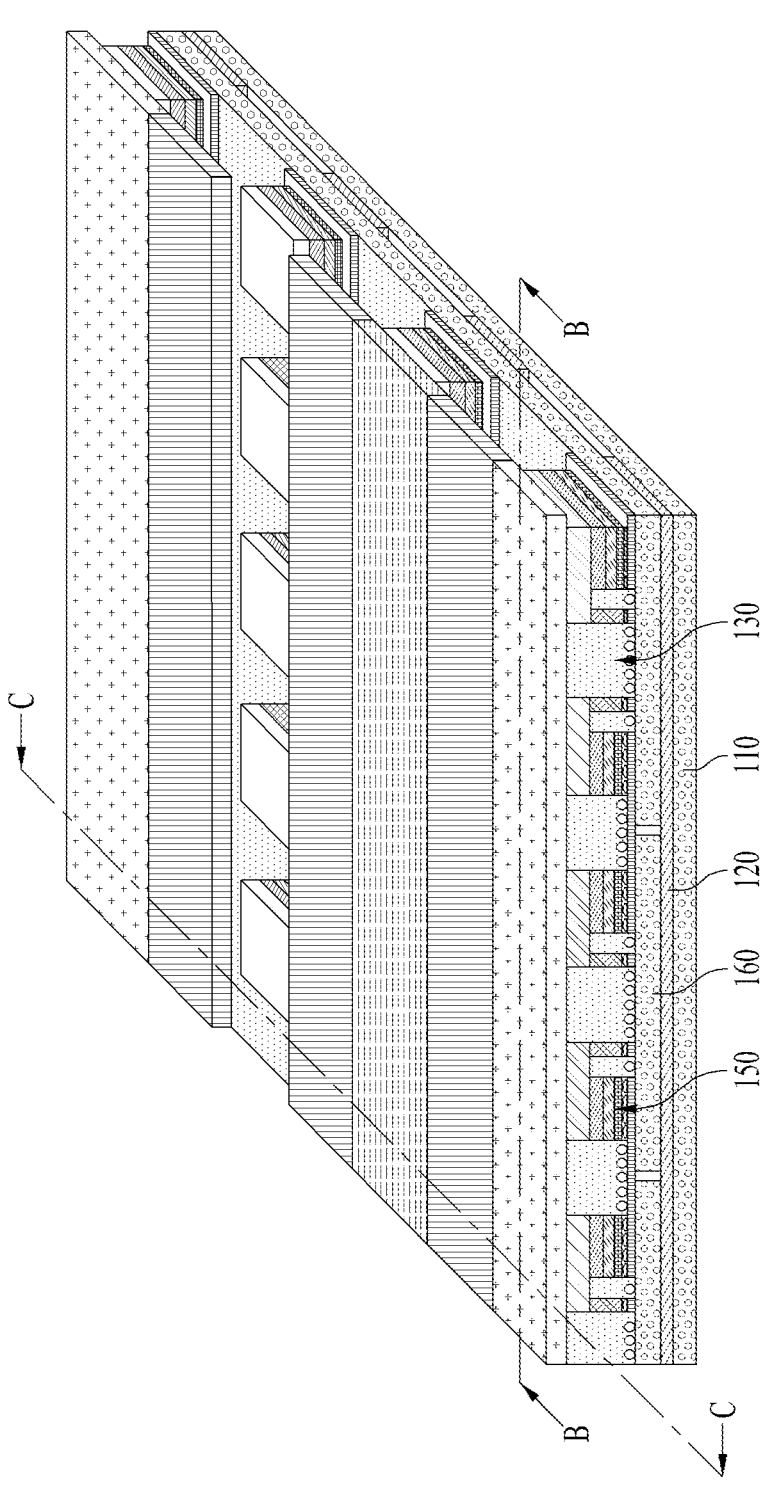
FIG. 2 is a partially enlarged diagram showing a part A shown in FIG. 1.

FIG. 2 is a partially enlarged view showing part A of FIG. 1.

Figure 3A:
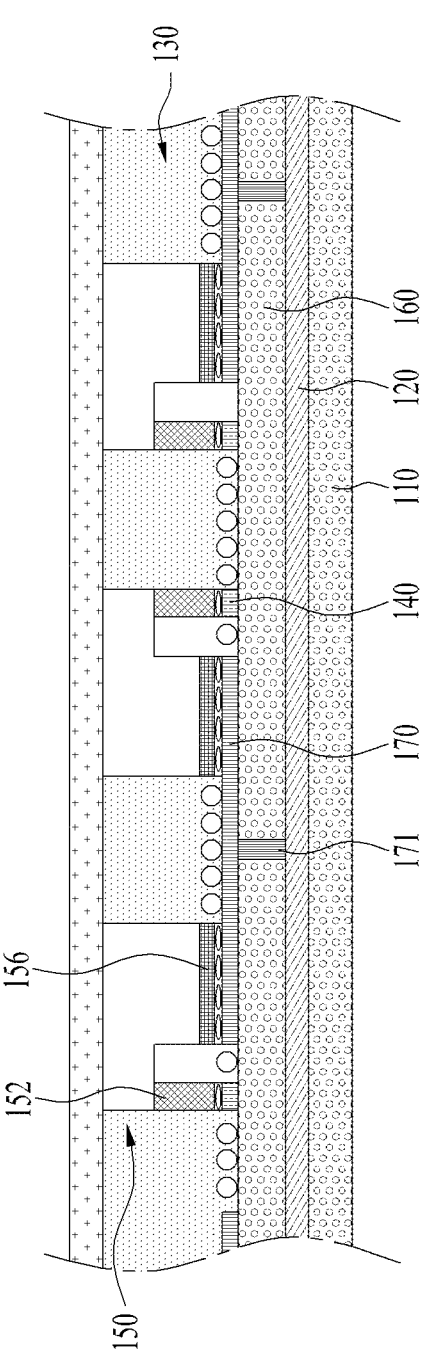
Figure 3B:
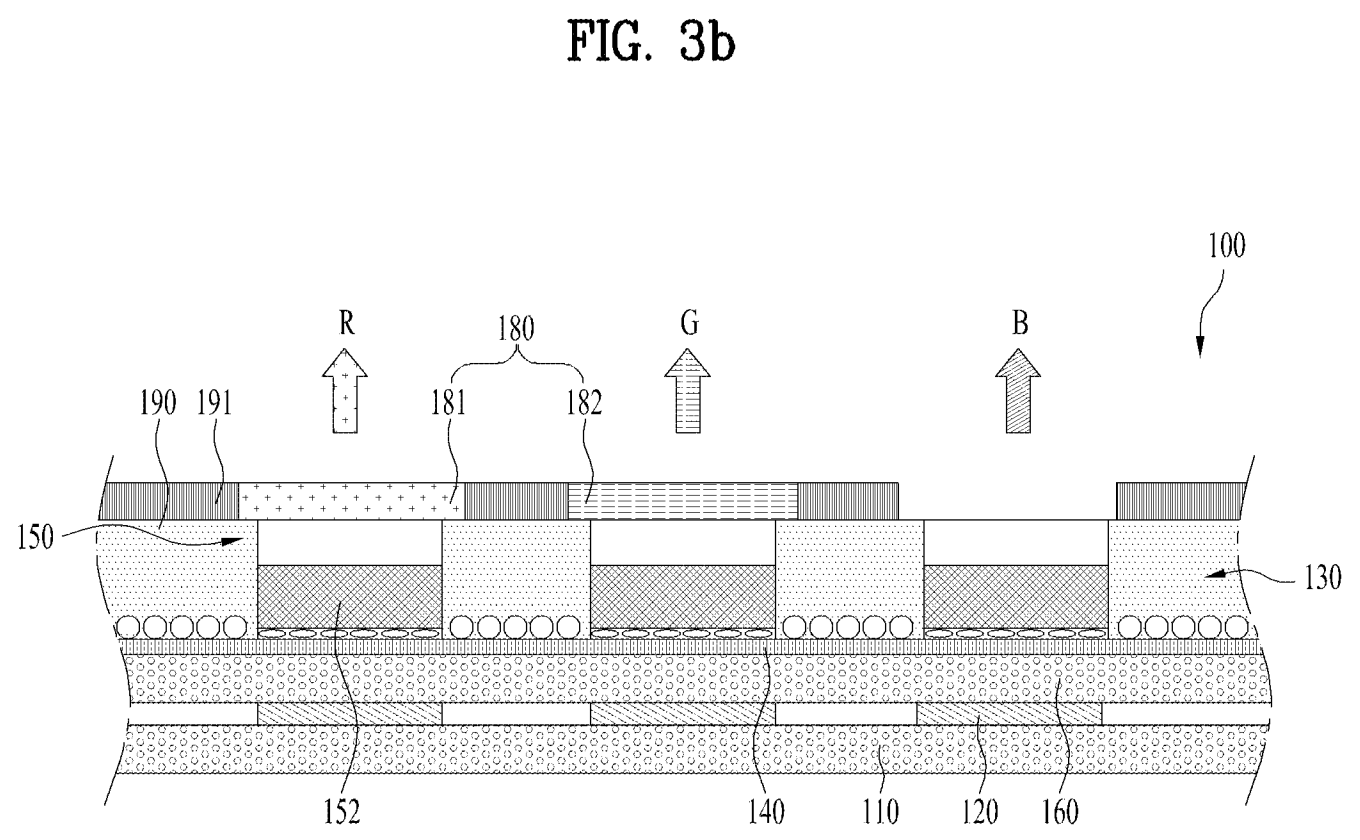

FIGS. 3A and 3B are cross-sectional views taken along lines B-B and C-C in FIG. 2.

Figure 4:
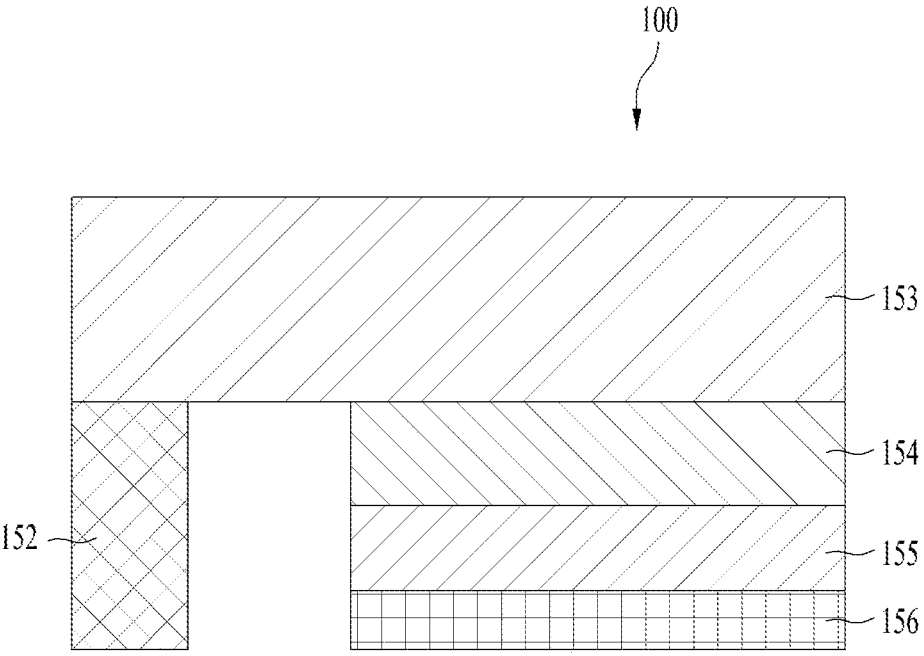
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
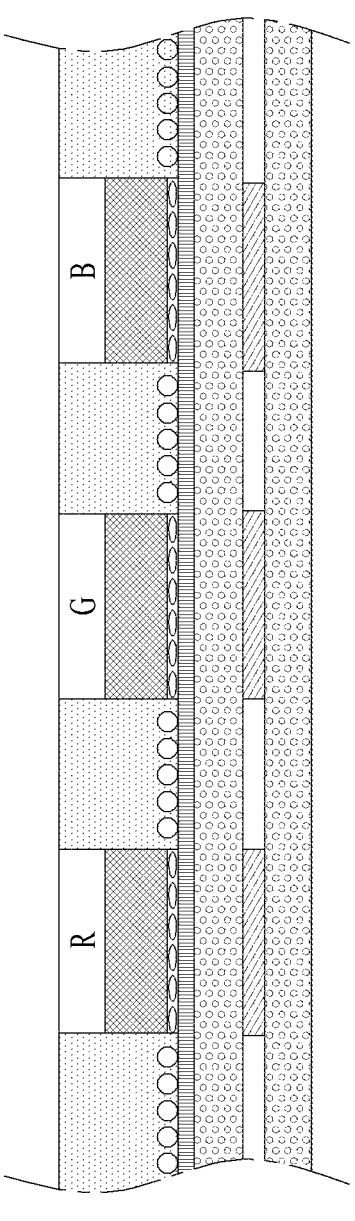
FIGS. 5A to 5C are conceptual diagrams illustrating various examples of color implementation with respect to a flip-chip type semiconductor light emitting element.
Figure 5B:
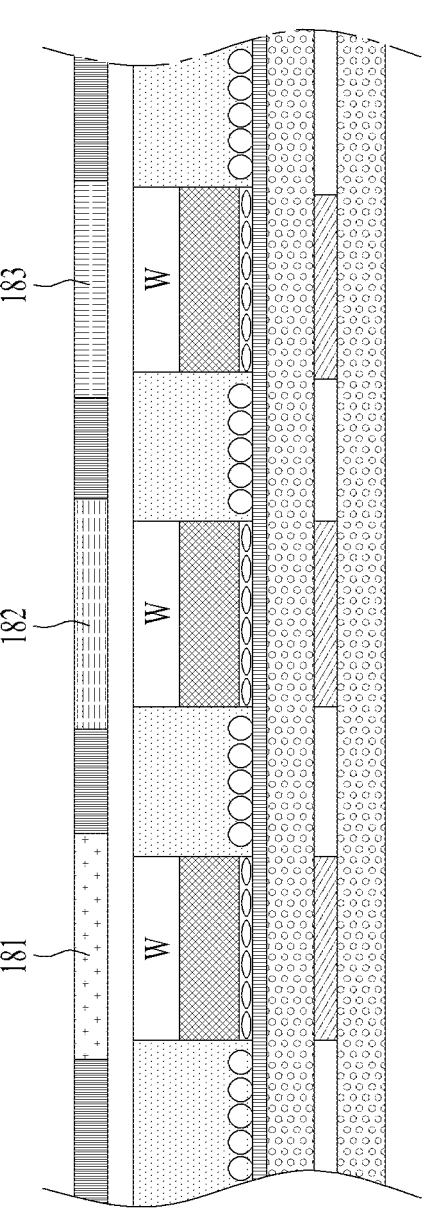
Figure 5C:
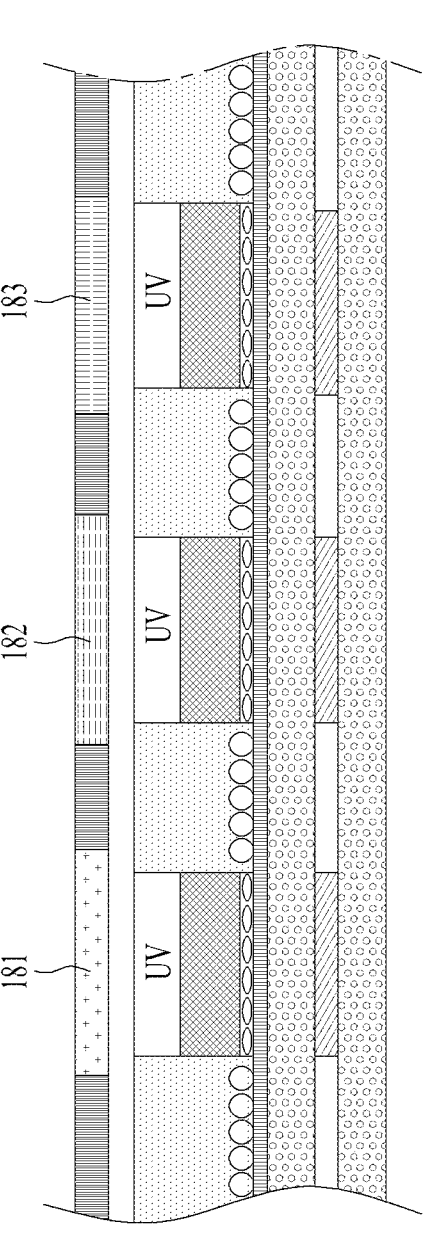

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting element array, and a phosphor conversion layer 180 may be formed on the light emitting element array.

The light emitting element array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
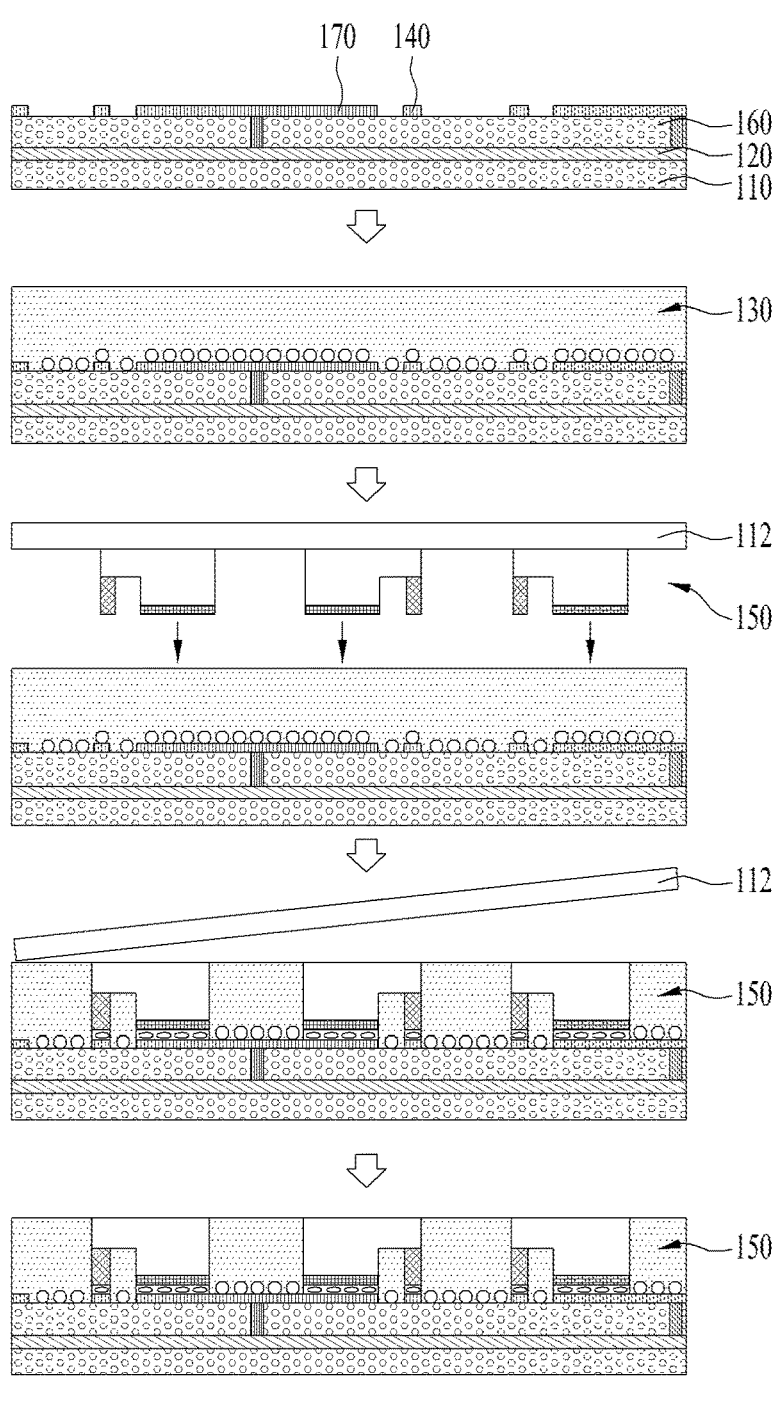
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140.

The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
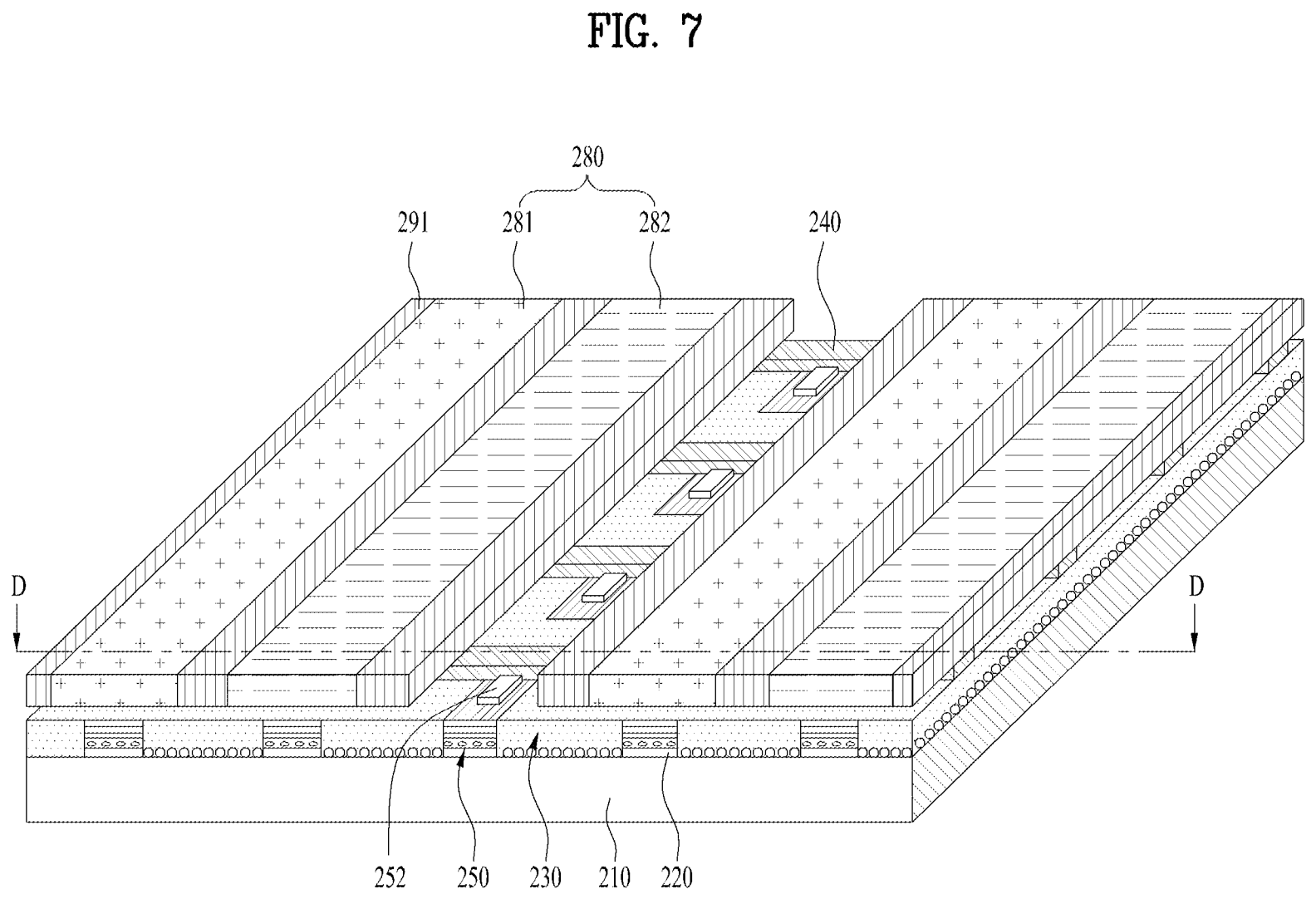
Figure 8:
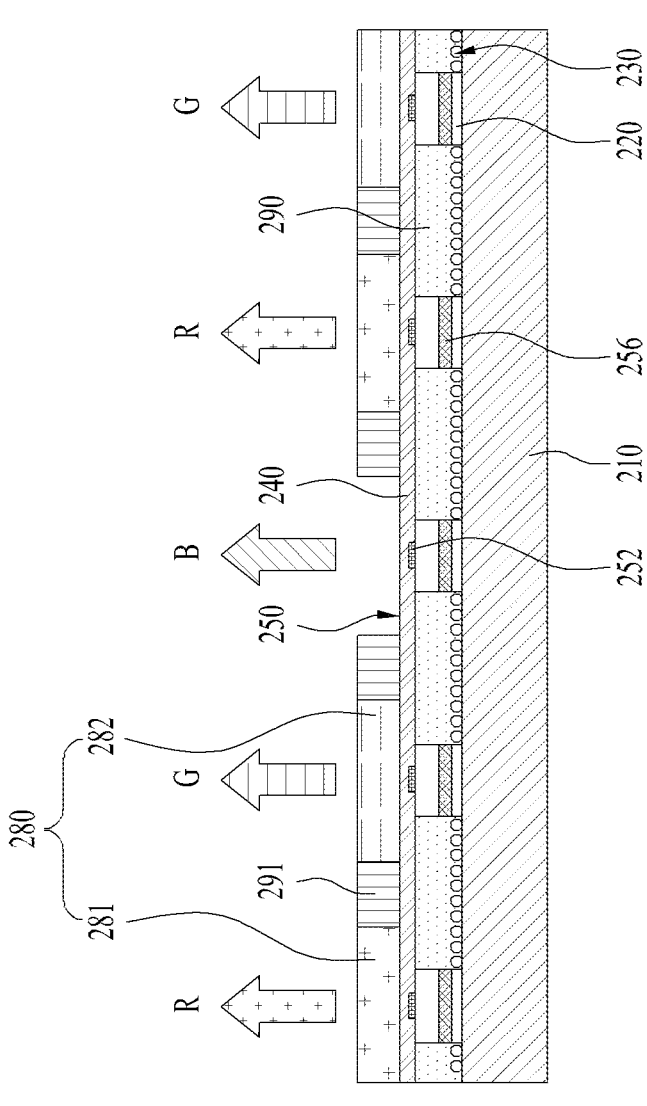
FIG. 8 is a cross-sectional diagram taken along a cutting line D-D shown in FIG. 8.
Figure 9:
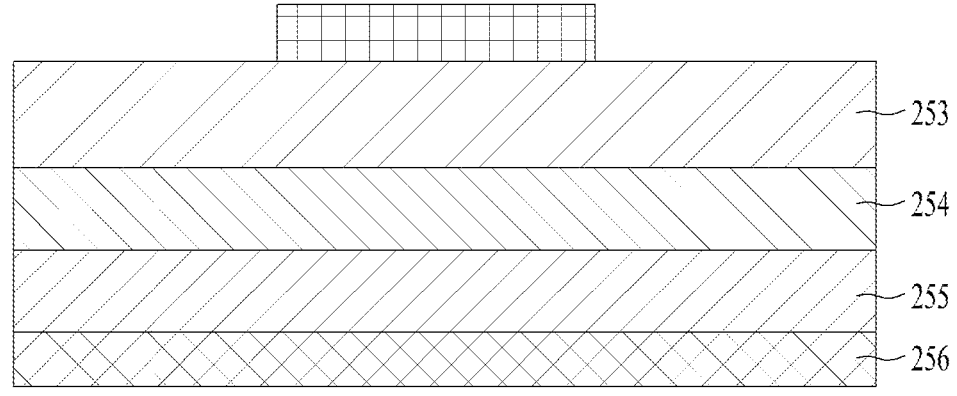
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250.

Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. Further, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
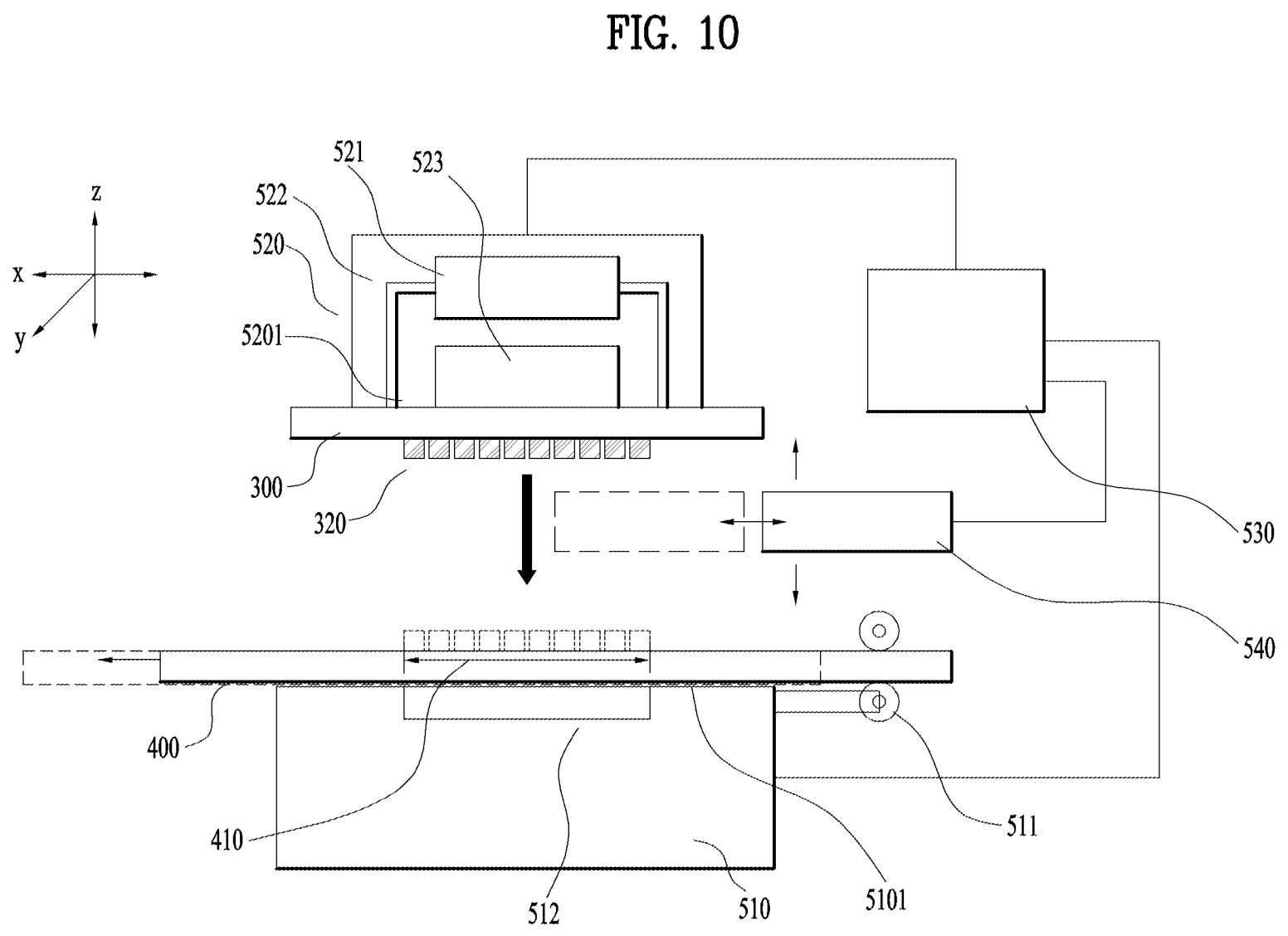
Figure 11:
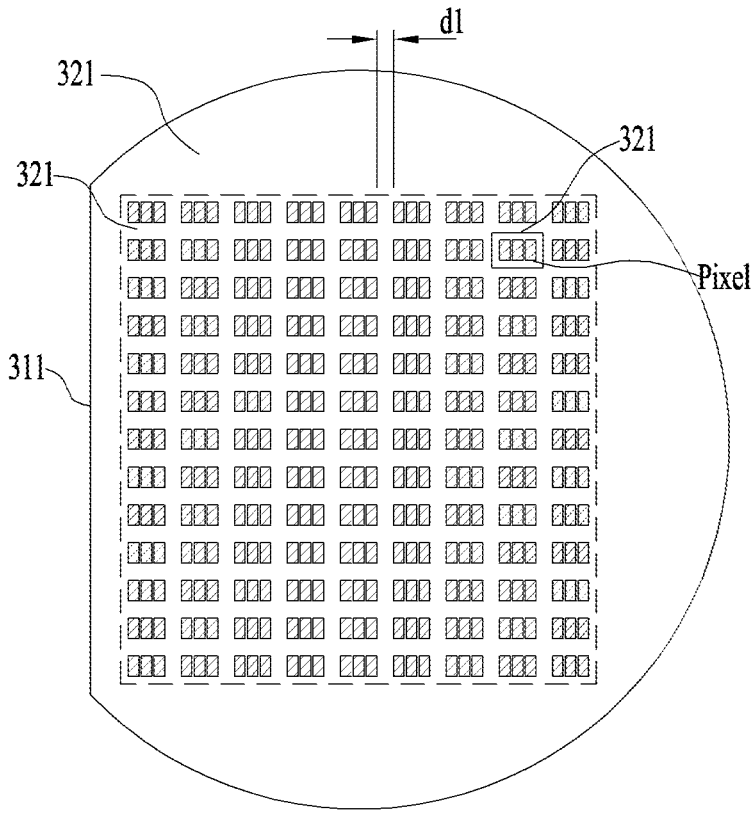
FIG. 11 is a top view of a donor including a semiconductor light emitting element array.

FIG. 10 is a basic conceptual diagram of a thermocompression device for thermally compressing a semiconductor light emitting element array on a wiring substrate. FIG. 11 is a top view of a donor including a semiconductor light emitting element array.

Semiconductor light emitting elements 321 may form an array 320 and may be disposed on a temporary substrate 310 of a donor 300. Specifically, the semiconductor light emitting element array 321 may be an array in which a plurality of pixels are arranged. Here, a pixel may contain a plurality of semiconductor light emitting elements 321. For example, the pixel may be composed of a semiconductor light emitting element responsible for red light emission, a semiconductor light emitting element responsible for green light emission, and a semiconductor light emitting element responsible for blue light emission.

The semiconductor light emitting element 321 may be the flip-chip type light emitting device 140 shown in FIG. 4. The semiconductor light emitting element, specifically, the semiconductor light emitting element 321 may be disposed on the donor 300 such that a semiconductor layer is connected to the temporary substrate 310 and an electrode is exposed. Here, the temporary substrate 310 may be a sapphire substrate on which the semiconductor light emitting element 321 is grown.

The pixels may be spaced apart from each other by a predetermined spacing d1 to form the array 320. The spacing d1 between the pixels may be referred to as a pixel pitch.

The temporary substrate 310 may be formed in a circular shape and include a flat zone 311 indicating an arrangement direction of the semiconductor light emitting elements 321. The flat zone 311 may be directed in a direction parallel to a direction in which the semiconductor light emitting elements 321 are arranged. Specifically, the flat zone 311 may be directed in parallel along one edge of the semiconductor light emitting element array 320. In some cases, the temporary substrate 310 may have a rectangular shape parallel to the semiconductor light emitting element array 320. That is, the temporary substrate 310 may have a plurality of flat zones 311 parallel to respective edges of the semiconductor light emitting element array 320.

A thermocompression device may thermally compress the semiconductor light emitting element array 320 on the donor 300 to a wiring substrate 400 in a collective manner.

The thermocompression device may include a lower head 510 for supporting the wiring substrate 400, an upper head 520 that moves the donor 300 and compresses the semiconductor light emitting element array 320 to a first area 410 of the wiring substrate 400, and heaters 512 and 523 that heat at least one of the lower head and the upper head. In addition, thermocompression device may include sensing portion 540 for sensing alignment of the wiring substrate 400 with the semiconductor light emitting element array 320. At least one of the lower head 510, the upper head 520, the heaters 512 and 523, and the sensing portion 540 may be controlled via a controller 530 of the thermocompression device.

The lower head 510 may include an upper surface 5101 for supporting the wiring substrate 400 in a flat state. The upper surface 5101 may be disposed on an xy plane. Specifically, the lower wiring substrate 400 may include the plurality of semiconductor light emitting element arrays 320, and the upper surface of the lower head 510 may have an area size capable of supporting such wiring substrate 400. Specifically, the upper surface 5101 of the wiring substrate 400 may be larger than an area size occupied by the semiconductor light emitting element arrays 320.

The lower head 510 may include heater 512 for heating the first area 410 where the semiconductor light emitting element arrays 320 are thermally compressed. The heater 512 may heat only an area size corresponding to the first area 410 or an area containing the first area 410. The heater 512 may generate heat while the upper head 520 compresses the semiconductor light emitting element arrays 320. In some cases, heater 512 may generate heat from when a compression pressure is equal to or higher than a preset pressure. Alternatively, the heater 512 may begin to warm up prior to the compressing.

The wiring substrate 400 may move in a plane on the upper surface 5101 of the lower head 510 via a roller assembly 511 disposed in the thermocompression device. The roller assembly 511 may be disposed at one side of the lower head 510 or may be disposed on a main frame for fixing the lower head 510. Here, the main frame is a frame forming a body of the thermocompression device, and components included in the thermocompression device may be mounted on the main frame. Specifically, the roller assembly 511 may move the wiring substrate 400 in at least one direction on the xy plane. The roller assembly 511 may include at least one of a first roller that moves the wiring substrate 400 in a x direction and a second roller that moves the wiring substrate 400 in a y direction.

The upper head 520 as a component to move and compress the donor 300 may include a fixing portion 521 for fixing the donor 300. Specifically, the upper head 520 may include a parallel contact surface 5201 in contact with a rear surface of the donor 300. The upper head 520 may move on the xy plane or move along a z-axis direction. In some cases, the upper head 520 may be rotationally driven such that a direction in which the contact surface 5201 is directed is changed. Here, the contact surface 5201 may be disposed on the xy plane when the upper head 520 thermally compresses the semiconductor light emitting element array 320 to the wiring substrate 400.

The fixing portion 521 may be in a shape of a pair of tongs and fix edges of the donor 300, and in some cases may adsorb the rear surface of the donor 300 to move the donor 300. In order to adsorb the rear surface of the donor 300, the fixing portion 521 may include a pipe 520 in communication with the contact surface 5201 of the upper head 520. The fixing portion 210 may adsorb the rear surface of the donor 300 with the pipe 520 to keep the donor 300 in contact with the contact surface 5201.

The upper head 520 may include the heater 512 that heats an area size corresponding to the semiconductor light emitting element arrays 320. In some cases, the heater 523 may heat an entire front surface 5201 of the upper head 520. The heater 523 may generate heat while the upper head 520 compresses the semiconductor light emitting element arrays 320. In some cases, heater 523 may generate heat from when a compression pressure is equal to or greater than a preset pressure. Alternatively, the heater 523 may begin to warm up prior to the compressing.

The sensing portion 540 may sense a position of the upper head 520. Specifically, the sensing portion 540 may sense an arranged position of the semiconductor light emitting element array 320 on the upper head 520. In addition, the sensing portion 540 may sense a position of the wiring substrate 400. Specifically, the sensing portion may sense the movement of the wiring substrate 400 on the xy plane with respect to the lower head 510. The sensing portion 540 may be a component that moves on the xy plane and additionally moves on the z-axis. Before the semiconductor light emitting element arrays 320 are thermally compressed to the wiring substrate 400, the sensing portion 540 may be located between the semiconductor light emitting element arrays 320 and the wiring substrate 400, check arranged states of the arrays 320 and the substrate 400, and move to a position that does not interfere with the thermal compression.

The wiring substrate 400 may have an area size larger than that occupied by the semiconductor light emitting element arrays 320. The wiring substrate 400 as a component corresponding to the substrate 110 in FIG. 2 may be composed of circuit wiring electrically connected to the semiconductor light emitting element arrays 320 and a base substrate including the circuit wiring and has flexibility. That is, the wiring substrate 400 may be a substrate for implementing a flexible or stretchable display. Such flexibility of the wiring substrate 400 may be a problem in the process of thermally compressing the plurality of semiconductor light emitting element arrays 320. Hereinafter, a description will be made in detail with reference to FIGS. 12 to 14.

Figure 12:
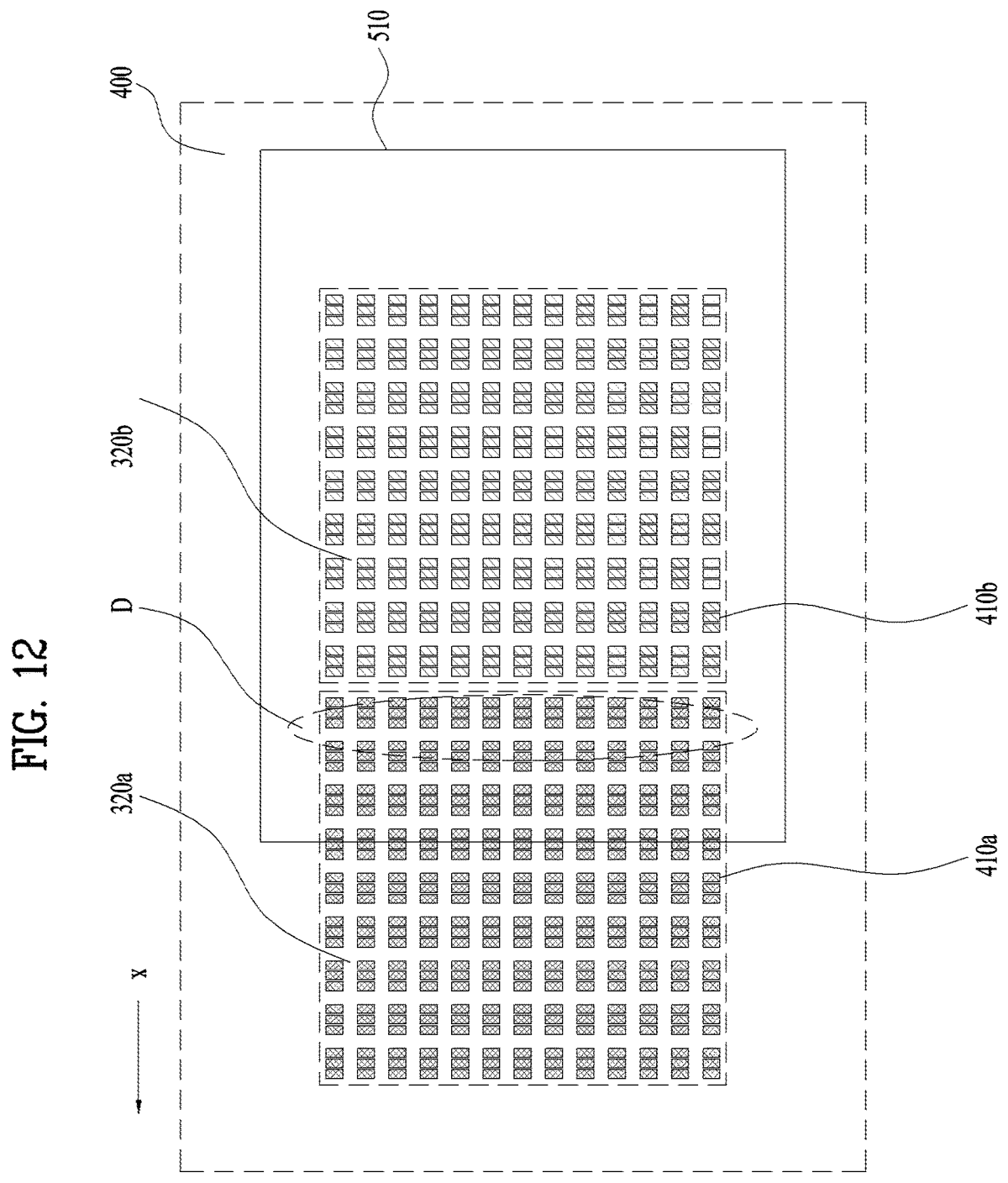
Figure 13:
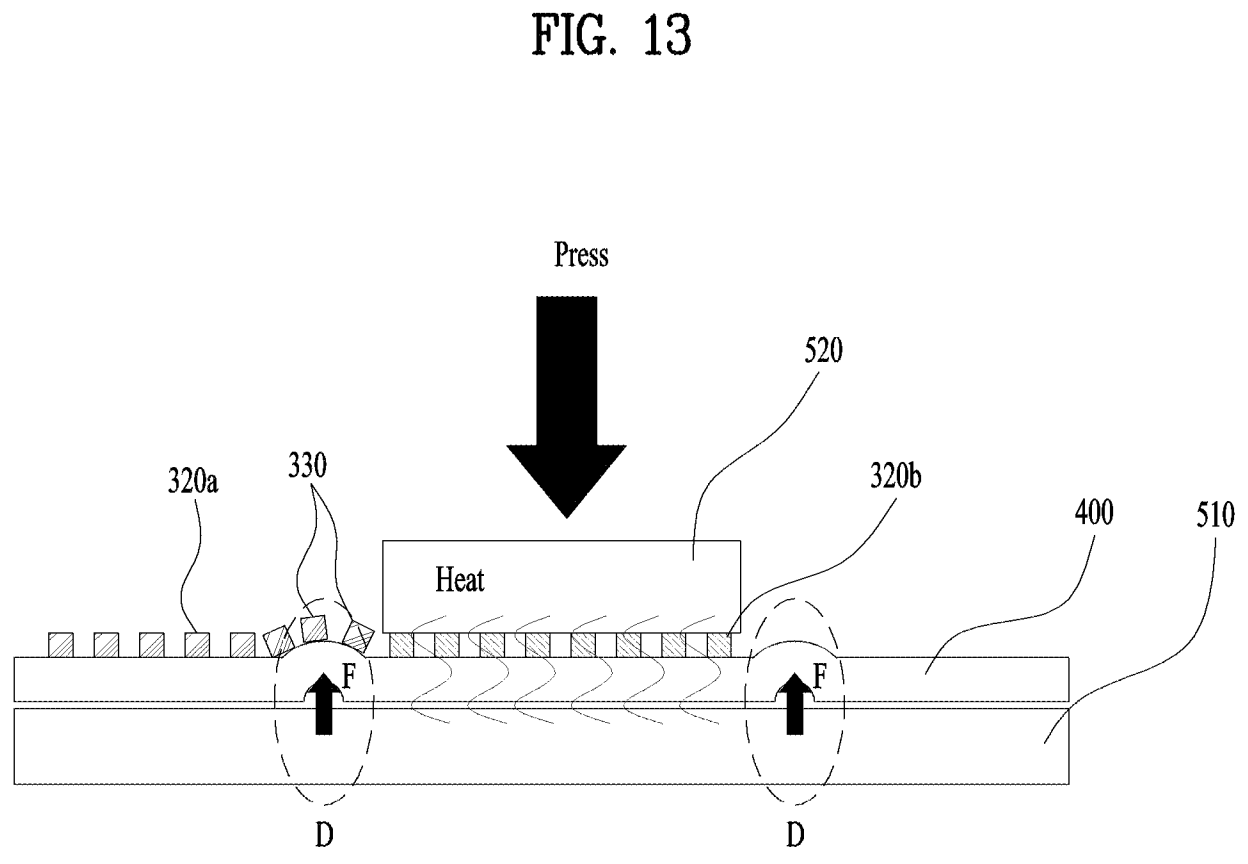
Figure 14:
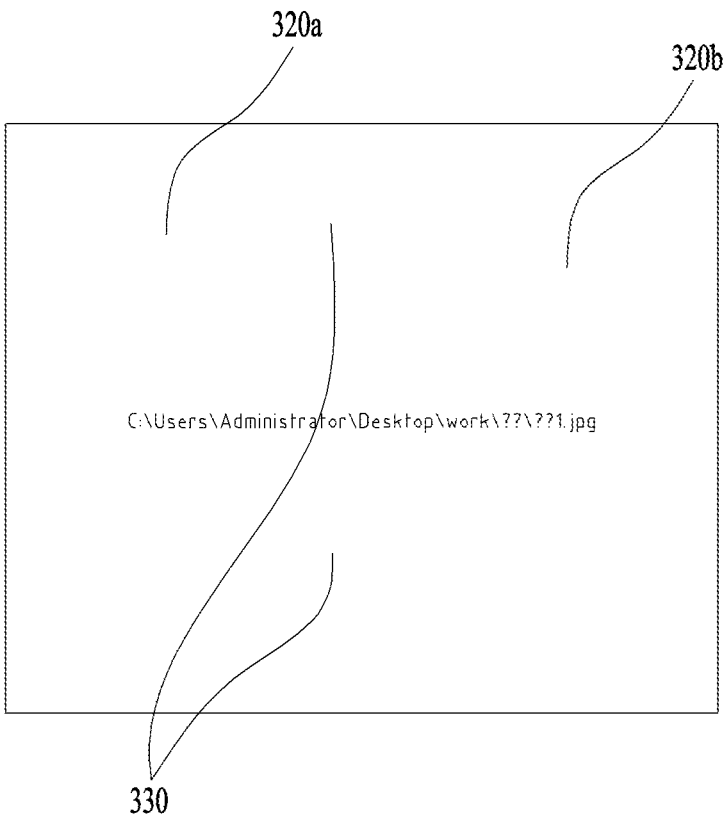
FIG. 14 is a view illustrating a phenomenon in which semiconductor light emitting elements of a semiconductor light emitting element array, which is thermally compressed first, adjacent to a semiconductor light emitting element array that is thermally compressed later are not lit.

FIG. 12 is a top view of a lower head to illustrate a process of connecting and thermally compressing semiconductor light emitting element arrays to a wiring substrate. FIG. 13 is a view for illustrating a problem occurring in a process of connecting and thermally compressing semiconductor light emitting element arrays to a wiring substrate. FIG. 14 is a view illustrating a phenomenon in which semiconductor light emitting elements of a semiconductor light emitting element array, which is thermally compressed first, adjacent to a semiconductor light emitting element array that is thermally compressed later are not lit.

Specifically, FIGS. 12 to 14 show an embodiment of thermally compressing a plurality of semiconductor light emitting element arrays 320*a* and 320*b* to the wiring substrate 400 using the thermocompression device in FIG. 12. The semiconductor light emitting element arrays 320a and 320b may be thermally compressed to the wiring substrate 400 in the same area size and may be thermally compressed adjacent to each other. Hereinafter, the semiconductor light emitting element array 320a that is first thermally compressed will be referred to as a first semiconductor light emitting element array 320a, and the semiconductor light emitting element array 320b that is thermally compressed later will be referred to as a second semiconductor light emitting element array 320b.

The thermocompression device may thermally compress the first semiconductor light emitting element array 320a to the first area 410a of the wiring substrate 400 and thermally compress the second semiconductor light emitting element array 320b to a second area 410b adjacent to the first area 410a. The second area 410b may have the same area size as the first area 410a. The first area 410a and the second area 410b may have area sizes corresponding to the first semiconductor light emitting element array 320a and the second semiconductor light emitting element array 320b, respectively. The first semiconductor light emitting element array 320a and the second semiconductor light emitting element array 320b may be thermally compressed to the first area 410a and the second area 410b, respectively, so as to be spaced apart from each other by the pitch d1 (see FIG. 11).

In the thermocompression device, after the first semiconductor light emitting element array 320a is thermally compressed to the first area 410a of the wiring substrate 400, the wiring substrate 400 may move in a x-axis direction along the upper surface 5101 of the lower head 510 and then the second semiconductor light emitting element array 320b may be thermally compressed to the second area 410b. In some cases, in the thermocompression device, after the first semiconductor light emitting element array 320a is thermally compressed to the first area 410a of the wiring substrate 400, at least one of the lower head 510 and the upper head 520 may move to thermally compress the second semiconductor light emitting element array 320b to the second area 410b.

The thermocompression device may provide heat and pressure to the wiring substrate 400 in the process of thermally compressing the first semiconductor light emitting element array 320a and the second semiconductor light emitting element array 320b to the wiring substrate 400. The wiring substrate 400 is a substrate having the flexibility, so that a phenomenon in which a periphery (e.g., D) of a thermally compressed area is rolled may occur. In the past, such phenomenon did not appear because the wiring substrate 400 is hard, but the wiring substrate 400, which is the basis of recent flexible displays and stretchable displays, has the flexibility, so that such phenomenon appears.

The phenomenon in which the periphery of the area to be thermally compressed in the wiring substrate 400 is rolled may cause a problem that semiconductor light emitting elements 330 thermally compressed on the periphery D in the first semiconductor light emitting element array 320a that is first thermally compressed are not lit. Specifically, the periphery D may be deformed to have a curvature by a rolling force F while the second semiconductor light emitting element array 320b is thermally compressed, and a compressed state of the semiconductor light emitting elements 330 may be damaged.

Hereinafter, an embodiment that prevents damage of a compressed state of semiconductor light emitting elements adjacent to the second area 410b of the first semiconductor light emitting element array 320a that is thermally compressed to the first area 410b while the second semiconductor light emitting element array 320b is thermally compressed to the second area 410b of the wiring substrate 400 will be described.

Figure 15:
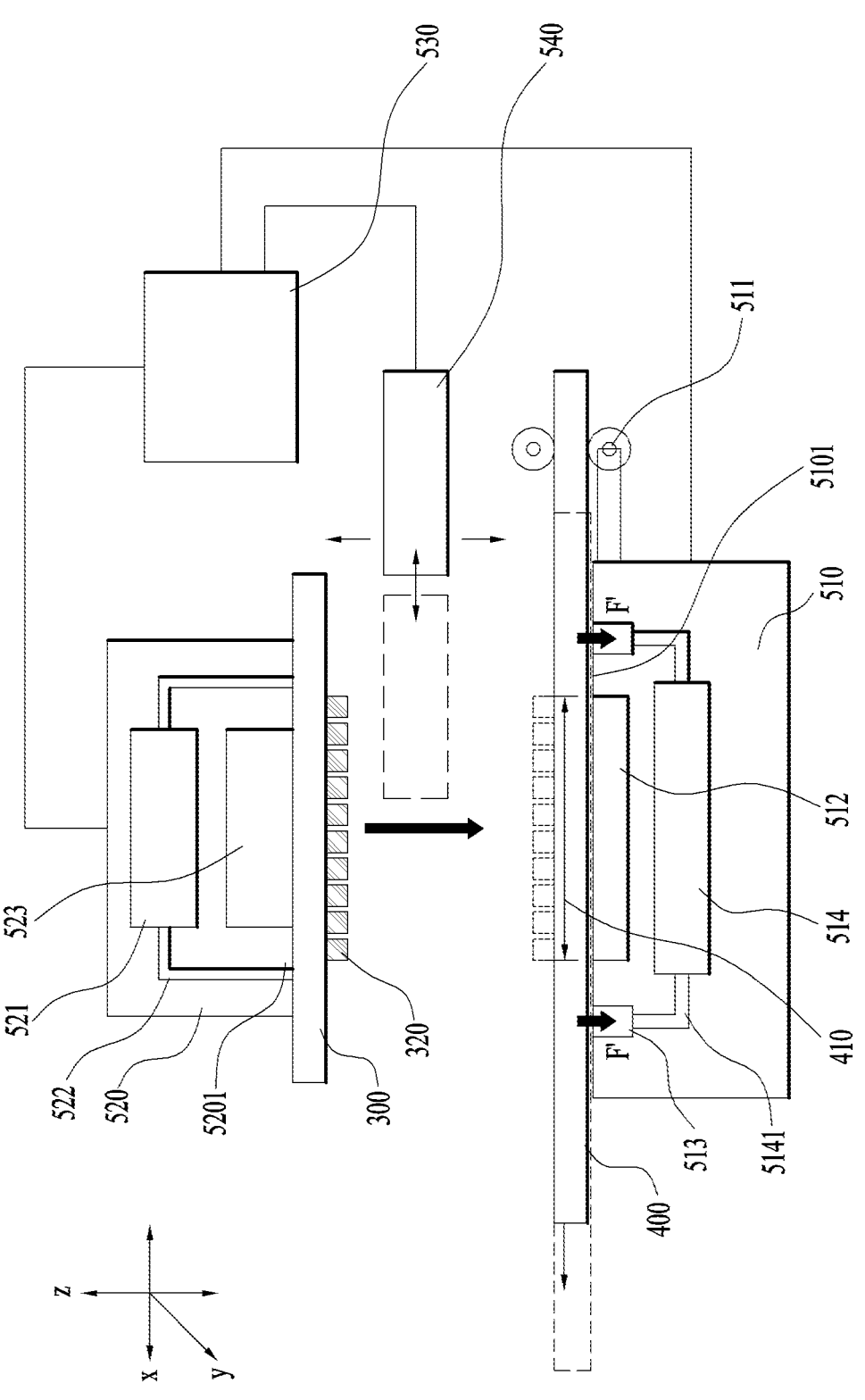
FIG. 15 shows an embodiment of a thermocompression device to solve a problem in FIG. 14.
Figure 16:
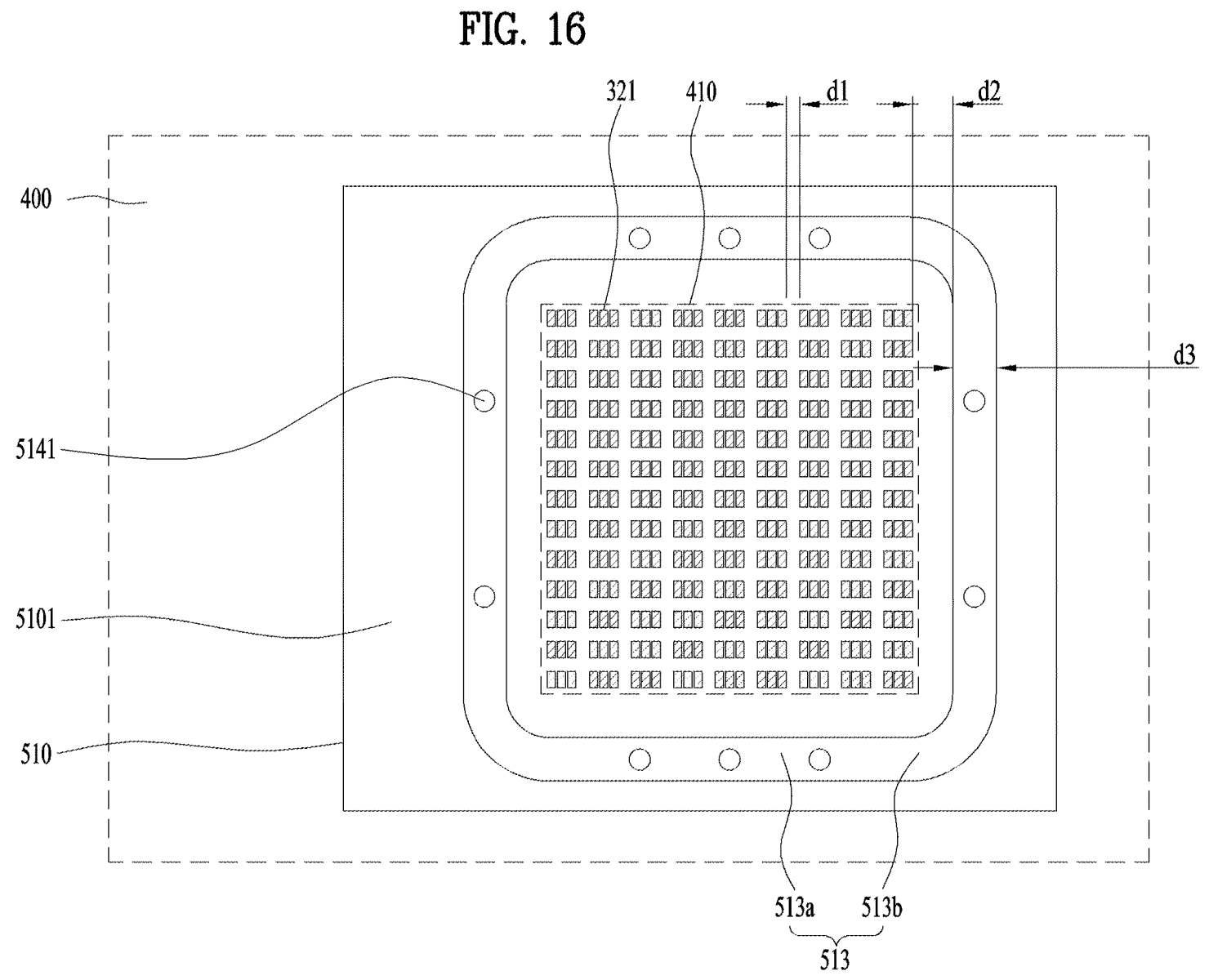

FIG. 15 shows an embodiment of a thermocompression device to solve a problem in FIG. 14. FIG. 16 is a top view of a lower head to illustrate alignment of an suction groove of a lower head with a semiconductor light emitting element array. A description of the same component may refer to FIG. 10.

The thermocompression device may include the lower head 510 for supporting the wiring substrate 400, the upper head 520 that moves the donor 300 and compresses the semiconductor light emitting element array 320 to the first area 410 of the wiring substrate 400, and the heaters 512 and 523 that heat at least one of the lower head and the upper head. In addition, the thermocompression device may include the sensing portion 540 for sensing the alignment state between the wiring substrate 400 and the semiconductor light emitting element array 320. At least one of the lower head 510, the upper head 520, the heaters 512 and 523, and the sensing portion 540 may be controlled via the controller 530 of the thermocompression device.

The thermocompression device may connect and thermally compress the plurality of semiconductor light emitting element arrays 320 to the wiring substrate 400. To this end, the wiring substrate 400 may move in the plane on the upper surface 5101 of the lower head 510 via the roller assembly 511 disposed in the thermocompression device.

The lower head 510 may include an suction groove 513 defined along an edge of the first area 410. Specifically, the suction groove 513 may be defined in the upper surface of the lower head 510 to define a space between the lower head 510 and the wiring substrate 400 disposed on the lower head 510.

The thermocompression device may include a suction portion 514 in communication with the suction groove 513 and holding the wiring substrate 400 by suction. Specifically, the suction portion 514 may suck air via a hole 5141 in communication with the suction groove 513 and adsorb the wiring substrate 400 disposed on the suction groove 513.

The thermocompression device may adsorb an edge of the first area 410 of the wiring substrate 400 via the suction portion 514 while thermally compressing the semiconductor light emitting element array 320 to the first area 410 of the wiring substrate 400. The suction portion 514 may adsorb the edge of the first area 410 of the wiring substrate 400 to prevent the edge of the first area 410 from being rolled. A description of a time and an intensity for the suction portion 514 to adsorb the wiring substrate 400 will be made in detail with reference to FIG. 17 below.

The suction groove 513 may be defined so as not to overlap the edge of the first area 410. Specifically, the suction groove 513 may have a preset width d3 and the edge of the first area 410 may not be located within the width of the suction groove 513. In some cases, the suction groove 513 may be defined at a preset distance d2 from the edge of the first area 410.

The distance d2 between the suction groove 513 and the first area 410 may be set based on the pixel pitch d1. Specifically, the distance d2 between the suction groove 513 and the first area 410 may be 3 times or more and 15 times or less of the pixel pitch d1.

When the distance d2 between the suction groove 513 and the first area 410 is less than 3 times the pixel pitch d1, the problem in that the semiconductor light emitting elements 321 located at the edge of the first area 410 may not be properly thermally compressed may occur. This is because, as the suction groove 513 adsorbs the wiring substrate 400, a pressure applied to the semiconductor light emitting elements 321 positioned at the edge of the first area 410 may fall below a required pressure.

When the distance d2 between the suction groove 513 and the first area 410 exceeds 15 times the pixel pitch d1, a phenomenon in which the wiring substrate 400 is rolled at the periphery may occur. The wiring substrate 400 is a substrate having elasticity, and a curvature of the wiring substrate 400 may be formed between the suction groove 513 and the first area 410.

The suction groove 513 may be divided into a straight section 513a and a curvature section 513b. The first area 410 may correspond to the rectangular area, the straight section 513a may be formed as a straight line along the edge of the first area 410, and the curvature section 513b may be formed along a radius of curvature based on a vertex of the first area 410. The radius of curvature of the curvature section 513b may correspond to the distance d2. The suction groove 513 may maintain the same distance from the first area 410 as d2 by including the curvature section 513b.

The suction groove 513 may include the plurality of holes 5141 in communication with the suction portion 514. Specifically, the plurality of holes 5141 may be defined at an equal distance along the suction groove 513. The plurality of holes 5141 may equalize the intensity at which the suction portion 514 adsorbs the wiring substrate 400 along the suction groove 513.

The width d3 of the suction groove 513 may be smaller than the pixel pitch d1. The suction groove 513 may be located between the pixels in the semiconductor light emitting element array that is thermally compressed first. As the suction groove 513 is located between the pixels, an external force applied to the semiconductor light emitting elements in the semiconductor light emitting element array that is thermally compressed first may be minimized.

Figure 17:
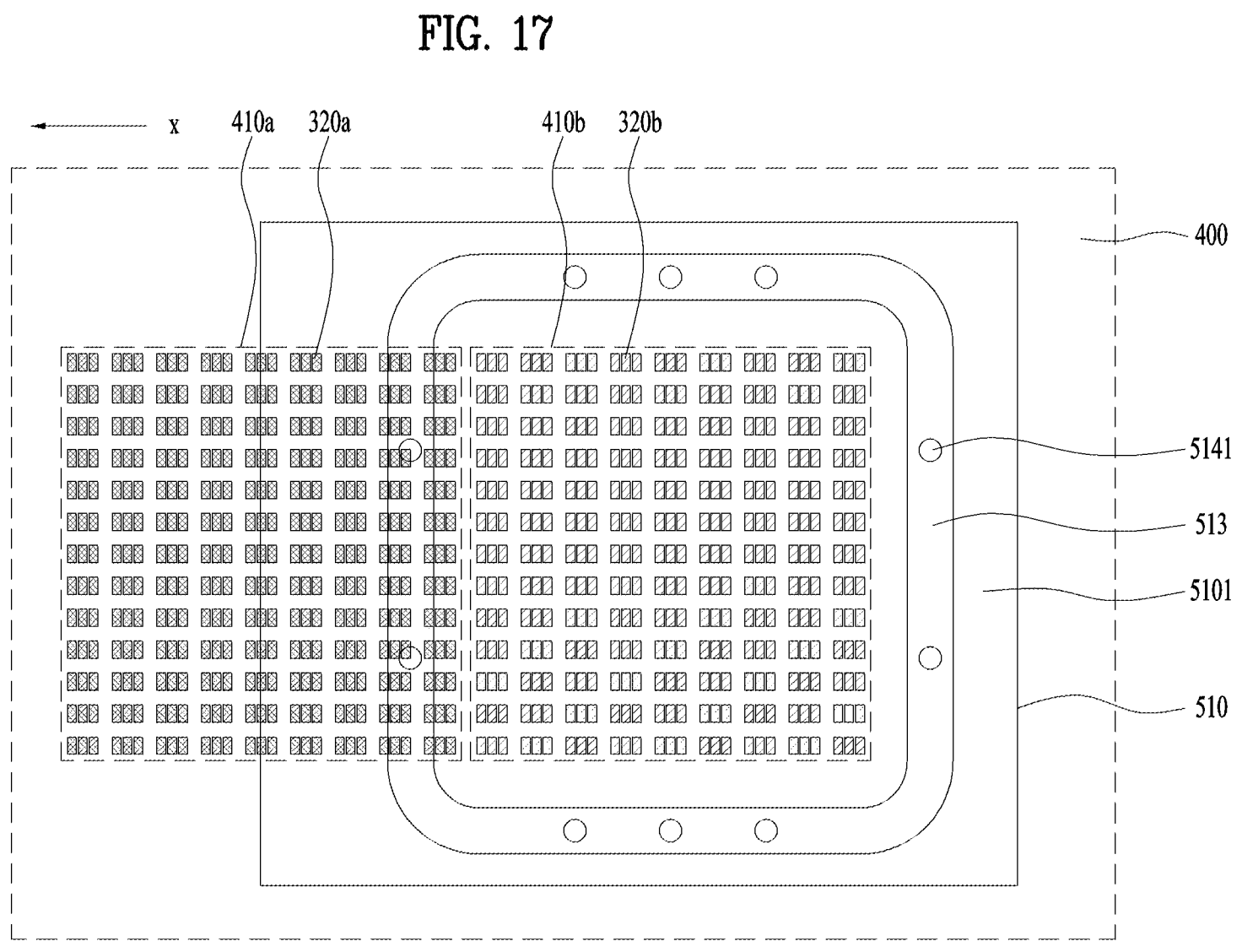

FIG. 17 is a top view of a lower head to illustrate a process of connecting and thermally compressing semiconductor light emitting element arrays to a wiring substrate. Specifically, FIG. 17 illustrates an operation of thermally compressing the first semiconductor light emitting element array 320a and connecting and thermally compressing the second semiconductor light emitting element array 320b. A description of the same component will be made below with reference to FIGS. 15 and 16.

After the first semiconductor light emitting element array 410a is thermally compressed to the first area 410a of the wiring substrate 400 using the thermocompression device, the wiring substrate 400 may be moved in the x-axis direction. In this regard, the suction groove 513 may be positioned to include the first area 410a. Specifically, the suction groove 513 may be positioned to be spaced apart from the first area 410a by the preset distance d2.

In the thermocompression device, the wiring substrate 400 may be aligned such that the suction groove 513 covers the second area 410b adjacent to the first area 410a. At this time, the sensing portion 540 of the thermocompression device may be used. The second area 410b may have the same area size as the first area 410a, the first semiconductor light emitting element array 320a that is thermally compressed to the first area 410a and the second semiconductor light emitting element array 320b that is thermally compressed to the second area 410b may be arranged with the same pixel pitch d1, and a distance between the first semiconductor light emitting element array and the second semiconductor light emitting element array may also be the pixel pitch d1.

During the thermal compression of the second semiconductor light emitting element array 320b, the suction groove 513 may adsorb the wiring substrate 400 at the periphery of the second area 410b. Specifically, the suction portion 514 in communication with the suction groove 513 may generate an suction force.

The intensity at which the suction portion 514 adsorbs the wiring substrate 400 may be adjusted in response to at least one of a heating temperature and a heating time of the heaters 512 and 523 and the compression pressure of the upper head 520. For example, the suction portion 514 may increase the suction intensity as the heating temperature of the heaters 512 and 523 increases. In addition, the suction portion 514 may increase the suction intensity as the heating time of the heaters 512 and 513 increases. In addition, the suction portion 514 may increase the suction intensity as the compression pressure of the upper head 520 increases. In some cases, the suction portion 514 may adsorb the wiring substrate 400 even before the compression pressure is applied from the upper head 520.

Figure 18:
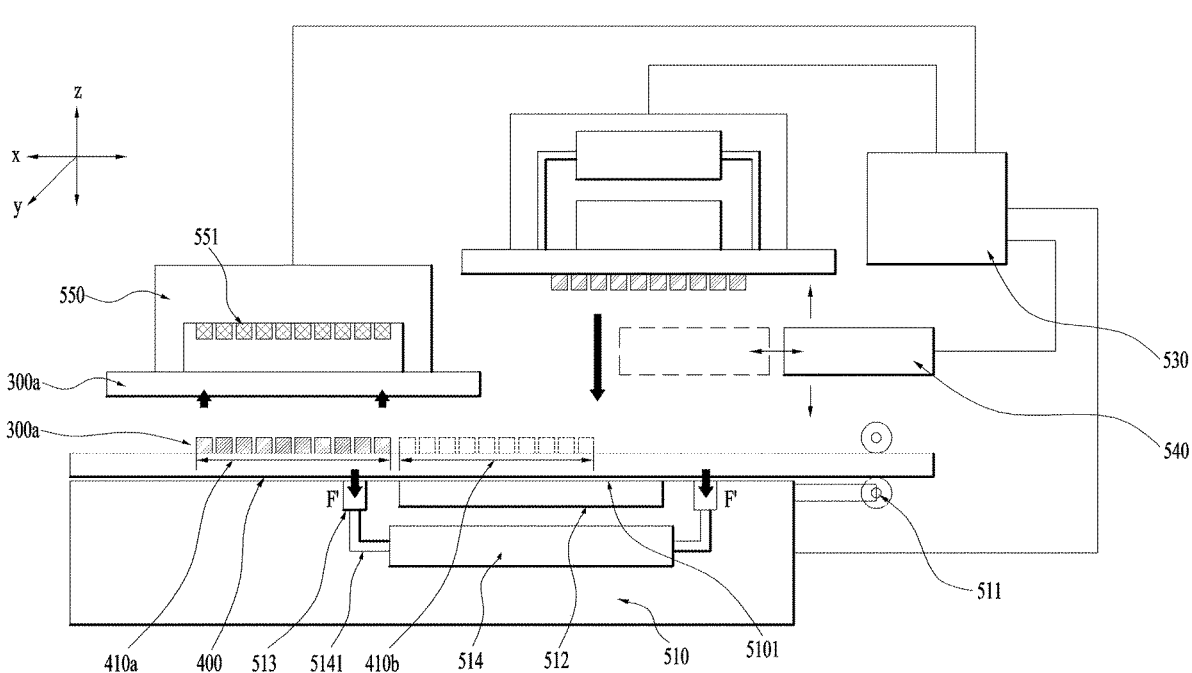
FIG. 18 shows another embodiment of a thermocompression device to solve a problem in FIG. 14.

FIG. 18 shows another embodiment of a thermocompression device to solve a problem in FIG. 14. A description of the same component may be made with reference to FIGS. 15 to 17.

The thermocompression device may perform an operation of removing the first donor 300a having the first semiconductor light emitting element array 320a after thermally compressing the first semiconductor light emitting element array 320a and before thermally compressing the second semiconductor light emitting element array 320b. To this end, the thermocompression device may further include laser lift off (LLO) equipment 550 that removes the first donor 300a from the first semiconductor light emitting element array 320a while the first semiconductor light emitting element array 320a is thermally compressed.

Specifically, the thermocompression device may include the lower head 510 for supporting the wiring substrate 400, the upper head 520 that moves the donor 300 and compresses the semiconductor light emitting element arrays 320a and 320b to the first area 410 of the wiring substrate 400, and the heaters 512 and 523 for heating at least one of the lower head and the upper head. In addition, the thermocompression device may include the sensing portion 540 for sensing alignment of the wiring substrate 400 with the semiconductor light emitting element arrays 320a and 320b. At least one of the lower head 510, the upper head 520, the heaters 512 and 523, and the sensing portion 540 may be controlled via the controller 530 of the thermocompression device.

The thermocompression device may connect and thermally compress the plurality of semiconductor light emitting element arrays 320a and 320b to the wiring substrate 400. To this end, the wiring substrate 400 may move in the plane on the upper surface 5101 of the lower head 510 via the roller assembly 511 disposed in the thermocompression device.

The lower head 510 may include the suction groove 513 defined along the edge of the first area 410a or the second area 410b. Specifically, the suction groove 513 may be defined in the upper surface of the lower head 510 to define the space between the lower head 510 and the wiring substrate 400 disposed on the lower head 510.

The thermocompression device may include the suction portion 514 in communication with the suction groove 513 and holding the wiring substrate 400 by suction. Specifically, the suction portion 514 may suck the air via the hole 5141 in communication with the suction groove 513 and adsorb the wiring substrate 400 disposed on the suction groove 513.

The suction portion 514 may adsorb the wiring substrate 400 while the first semiconductor light emitting element array 320*a* is thermally compressed in the state in which the suction groove 513 surrounds the first area 410*a* and/or while the second semiconductor light emitting element array 320*b* is thermally compressed to the second area 410*b* in the state in which the suction groove 513 surrounds the second area 410*b*.

The thermocompression device may include the laser lift off (LLO) equipment 550 that removes the first donor 300*a* from the first semiconductor light emitting element 320*a* thermally compressed to the first area 410*a*. The laser lift off (LLO) equipment may include laser irradiation means 551 that emits a laser corresponding to the semiconductor light emitting element array. In addition, the laser lift off (LLO) equipment may further include separate suction portion for holding the first donor 330*a* removed from the first semiconductor light emitting element 320*a*. Here, the removal of the first donor 330*a* from the first semiconductor light emitting element 320*a* may mean removal of the temporary substrate 310 in FIG. 11 from the first semiconductor light emitting element array 320*a*.

The thermocompression device may thermally compress the second semiconductor light emitting element array 320*b* on the second area 410*b* and then remove the second donor 300*b* via the laser lift off (LLO) equipment. That is, the donors 300*a* and 300*b* may be removed via the laser lift off (LLO) equipment between respective cycles of connecting and thermally compressing the plurality of semiconductor light emitting element arrays to the wiring substrate 400, respectively.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. A thermocompression device for thermally compressing a semiconductor light emitting element array to a wiring substrate, the thermocompression device comprising:

a lower head for supporting the wiring substrate;

an upper head for compressing the semiconductor light emitting element array to a first area of the wiring substrate using a donor having the semiconductor light emitting element array;

a heater for heating at least one of the lower head and the upper head;

a suction groove defined in an upper surface of the lower head along an edge of the first area; and a suction portion in communication with the suction groove and configured to hold the wiring substrate by suction.

2. The thermocompression device of claim 1, wherein the suction portion is configured to hold the wiring substrate by suction while the semiconductor light emitting element array is thermally compressed to the first area.

3. The thermocompression device of claim 2, wherein the suction portion controls an intensity of holding the wiring substrate by suction in response to at least one of a heating temperature and a heating time of the heater and a compression pressure of the upper head.

4. The thermocompression device of claim 1, wherein the suction groove is defined to be spaced apart from the first area by a preset distance.

5. The thermocompression device of claim 4, wherein the suction groove is spaced apart from the first area by a distance of 3 times or more and 15 times or less of a pixel pitch of the semiconductor light emitting element array.

6. The thermocompression device of claim 4, wherein the first area corresponds to a rectangular area, wherein the suction groove includes a straight section formed along the edge of the first area and a curvature section formed to surround a vertex of the first area.

7. The thermocompression device of claim 1, wherein the suction groove is located between pixels of the semiconductor light emitting element array thermally compressed to the wiring substrate.

8. The thermocompression device of claim 7, wherein the suction groove has a width smaller than a width of a pixel pitch of the semiconductor light emitting element array.

9. The thermocompression device of claim 1, wherein the suction groove includes a plurality of holes in communication with the suction portion.

10. The thermocompression device of claim 9, wherein the suction groove includes the plurality of holes at an equal distance.

11. The thermocompression device of claim 1, further comprising a roller assembly for moving the wiring substrate in a plane on the upper surface of the lower head.

12. The thermocompression device of claim 11, wherein the roller assembly moves the wiring substrate in the plane on the upper surface of the lower head such that a second area adjacent to the first area and having the same area size as the first area is defined to surround the suction groove.

13. The thermocompression device of claim 1, further comprising a sensing portion for sensing alignment of the wiring substrate with the suction groove.

14. The thermocompression device of claim 1, further comprising laser lift off (LLO) equipment for removing the donor from the semiconductor light emitting element array while the semiconductor light emitting element array is thermally compressed to the first area.

15. A thermocompression device for thermally compressing a semiconductor light emitting element array to a wiring substrate, the thermocompression device comprising:

a first head for supporting the wiring substrate;

a second head for compressing the semiconductor light emitting element array to a first area of the wiring substrate using a donor having the semiconductor light emitting element array;

a heater for heating at least one of the first head and the second head;

a suction groove defined in an upper surface of the first head along an edge spaced apart from the first area; and a suction portion in communication with the suction groove configured to hold the wiring substrate on the upper surface of the first head by sucking air.

16. The thermocompression device of claim 15, wherein the suction groove is defined to be spaced apart from an edge of the first area by a preset distance.

17. The thermocompression device of claim 15, wherein the suction groove is spaced apart from the first area by a distance of 3 times or more and 15 times or less of a pixel pitch of the semiconductor light emitting element array.

18. The thermocompression device of claim 15, wherein the suction groove includes a straight section formed along the edge of the first area and a curvature section formed to surround a vertex of the first area.

19. The thermocompression device of claim 15, wherein the suction groove includes a plurality of holes in communication with the suction portion.

20. The thermocompression device of claim 15, further comprising a roller assembly for moving the wiring substrate in a plane on the upper surface of the first head.

* * * * *